(12) United States Patent
Sato

(10) Patent No.: US 7,815,767 B2
(45) Date of Patent: Oct. 19, 2010

(54) PLASMA PROCESSING APPARATUS

(75) Inventor: Tetsuji Sato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/802,811

(22) Filed: Mar. 18, 2004

(65) Prior Publication Data

US 2004/0182515 A1    Sep. 23, 2004

(30) Foreign Application Priority Data

Mar. 19, 2003    (JP)    ............................. 2003-075880

(51) Int. Cl.
*H01L 21/306*   (2006.01)
*C23C 16/00*    (2006.01)

(52) U.S. Cl. .............................. 156/345.47; 118/723 E

(58) Field of Classification Search .............. 118/723 E, 118/723 ER, 722, 723 R, 723 I, 723 IR, 723 MW, 118/723 ME, 723 MA, 723 MR, 723 AN, 118/728, 729; 156/345.47, 345.51, 345.52, 156/345.53, 345.54, 345.1, 345.3, 345.33, 156/345.34, 345.39, 345.4, 345.41, 345.42, 156/345.43, 345.46, 345.48, 345.49
See application file for complete search history.

(56) References Cited

U.S. PATENT DOCUMENTS

| | | | | |
|---|---|---|---|---|
| 5,266,119 A | * | 11/1993 | Taniguchi et al. | ........... 118/730 |
| 5,647,912 A | * | 7/1997 | Kaminishizono et al. | ... 118/719 |
| 5,980,687 A | * | 11/1999 | Koshimizu | ............. 156/345.29 |
| 5,997,687 A | * | 12/1999 | Koshimizu | ............. 156/345.44 |
| 7,147,749 B2 | * | 12/2006 | Nishimoto et al. | ...... 156/345.43 |
| 2003/0062128 A1 | * | 4/2003 | Denpoh | .................. 156/345.37 |
| 2004/0020599 A1 | * | 2/2004 | Tanaka et al. | ........... 156/345.29 |
| 2004/0035364 A1 | * | 2/2004 | Tomoyoshi et al. | ....... 118/723 E |

FOREIGN PATENT DOCUMENTS

WO    WO-0024047    *    4/2000

* cited by examiner

*Primary Examiner*—Luz L. Alejandro
(74) *Attorney, Agent, or Firm*—Oblon, Spivak, McClelland, Maier & Neustadt, L.L.P.

(57) ABSTRACT

A plasma processing apparatus of the present invention can reduce a manufacturing cost of the apparatus and a footprint by decreasing a load applied to a device for varying a distance between electrodes in comparison with a conventional apparatus and, at the same time, easily meet a scaling up of a substrate to be processed. A lower electrode and an upper electrode are installed inside a vacuum chamber. Provided at a lower electrode supporting member are openings for operating the upper electrode by using a driving mechanism installed outside the vacuum chamber. An intermediate ring is installed at bellows for air-tightly sealing the openings. Further, the intermediate ring is connected to a connecting member connected to an upper electrode supporting member and the driving mechanism.

12 Claims, 5 Drawing Sheets

PLASMA PROCESSING APPARATUS

FIELD OF THE INVENTION

The present invention relates to a plasma processing apparatus; and more particularly, to a plasma processing apparatus for performing a plasma process such as an etching process, a film forming process or the like by applying a plasma on a substrate to be processed, e.g., a semiconductor wafer, a glass substrate for use in a liquid crystal display (LCD) or the like.

BACKGROUND OF THE INVENTION

There has been used in a manufacturing field of semiconductor devices a conventional plasma processing apparatus for performing a plasma process such as an etching process, a film forming process or the like by applying a plasma generated in a vacuum chamber on a substrate to be processed, e.g., a semiconductor wafer, a glass substrate for use in an LCD or the like.

As the conventional plasma processing apparatus, a so-called parallel plate plasma processing apparatus has been known. The parallel plate plasma processing apparatus has a vacuum chamber in which a plasma is generated by applying a high frequency power to parallel plate electrodes, e.g., an upper electrode and a lower electrode facing each other in parallel, and then applied on a semiconductor wafer loaded on one of the electrodes, e.g., the lower electrode.

FIG. 5 shows a schematic cross sectional view of the parallel plate plasma processing apparatus. A reference numeral 1 in FIG. 5 indicates a vacuum chamber. Installed inside the vacuum chamber 1 are a lower electrode 2 serving as a mounting table for mounting thereon a semiconductor wafer W and an upper electrode 3 installed thereabove so as to face the lower electrode 2 in parallel.

A plurality of pores 3a are provided at the upper electrode 3, so that a process gas can be supplied from the pores 3a toward the semiconductor wafer W in a shower-like manner. Further, an exhaust port (not shown) is installed at a bottom portion of the vacuum chamber 1. By pumping the process gas out of the vacuum chamber 1 via the exhaust port, an inner space thereof can be set under a desired vacuum state. Furthermore, a high frequency power of a predetermined frequency is supplied from a high frequency power source (not shown) to a space between the lower electrode 2 and the upper electrode 3, thereby generating a plasma of the process gas in the vacuum chamber 1. The plasma thus generated then acts on the semiconductor wafer W, so that an etching process of the semiconductor wafer W or the like can be performed. Besides, a gate 4 for loading and unloading the semiconductor wafer W into and from the vacuum chamber 1 is installed at a sidewall of the vacuum chamber 1. A focus ring 5 is installed on a mounting surface of the lower electrode 2 so as to surround the semiconductor wafer W loaded thereon.

In such a parallel plate plasma processing apparatus, a plasma processing state is affected by the distance (gap) between the parallel plate electrodes, i.e., the distance from the lower electrode 2 to the upper electrode 3 in case of the plasma processing apparatus illustrated in FIG. 5. Therefore, there is known an apparatus capable of vertically moving one of the electrodes (the lower electrode 2 in the plasma processing apparatus of FIG. 5) and varying the distance between the electrodes (see, e.g., Japanese Patent Laid-open Publication No. 2000-286242 (page 3-5 and FIG. 1)).

Further, since the lower electrode 2 is vertically movable in the plasma processing apparatus of FIG. 5 as described above, an expansible/contractible bellows 6 is installed between a lower portion of the lower electrode 2 and a bottom part of the vacuum chamber 1 to air-tightly seal off an opening portion of the bottom part of the vacuum chamber 1.

However, since the inside of the vacuum chamber 1 is maintained at a certain vacuum level while the outside of the vacuum chamber 1 is under atmospheric pressure, a pressure difference between the inside and the outside of the vacuum chamber 1 is generated. Thus, an upward force is continuously exerted on the lower electrode 2 by the pressure difference.

Accordingly, in case the gap between the electrodes is widened by, e.g., lowering the lower electrode 2, the lower electrode 2 should be lowered against the pressure difference, thereby requiring an enormous force. Further, even in a normal state, a large force is also required to prevent the lower electrode 2 from being pushed upward to thereby maintain same in position. In order to meet such a load, a power source, such as a motor or the like, for driving the lower electrode 2 requires a great driving force and a mechanical operating system requires a great ruggedness. However, in that case, a manufacturing cost of the apparatus or a footprint is increased.

Recently, there has been a trend towards a larger diameter substrate to be processed such as a semiconductor wafer or the like, e.g., up to 12 inch. Therefore, a diameter of the lower electrode 2 also needs to be larger in order to meet the scaling up of the substrate to be processed. Accordingly, a force exerted on the lower electrode 2 increases in proportion to its area up to, e.g., about 5000 N to about 10000 N. As a result, the aforementioned problems become even more serious and, thus, it is difficult to resolve such problems.

As described above, in the conventional parallel plate plasma processing apparatus, a great load is exerted on a device for varying the distance between the electrodes because of the pressure difference between the inside and the outside of the vacuum chamber, thereby increasing the manufacturing cost and the footprint of the apparatus. Especially, it is difficult to meet the scaling up of the substrate to be processed.

SUMMARY OF THE INVENTION

It is, therefore, an object of the present invention to provide a plasma processing apparatus capable of reducing a manufacturing cost and a footprint of the apparatus by decreasing a load exerted on a device for varying a distance between electrodes in comparison with a conventional apparatus and, at the same time, easily meeting a scaling up of a substrate to be processed.

In accordance with the present invention, there is provide a plasma processing apparatus including: a vacuum chamber accommodating therein a substrate to be processed, allowing an inner space of the vacuum chamber to be maintained at a vacuum level; a first electrode fixedly disposed at a location in the vacuum chamber; a second electrode installed in the vacuum chamber and facing the first electrode, the second electrode being vertically movable so as to vary a distance between the first electrode and the second electrode; a driving mechanism for vertically moving the second electrode, the driving mechanism being installed outside the vacuum chamber; a bellows unit for air-tightly sealing an opening, the bellows unit having a frame-shaped member connected to the driving mechanism, wherein the opening, through which the second electrode is driven by the driving mechanism from the outside of the vacuum chamber, is provided at the vacuum chamber; an electrode supporting member for connecting the frame-shaped member to the second electrode, the electrode supporting member being installed in the vacuum chamber; and a high frequency power source generating plasma by supplying a high frequency power between the first electrode and the second electrode.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings.

Figure 1:
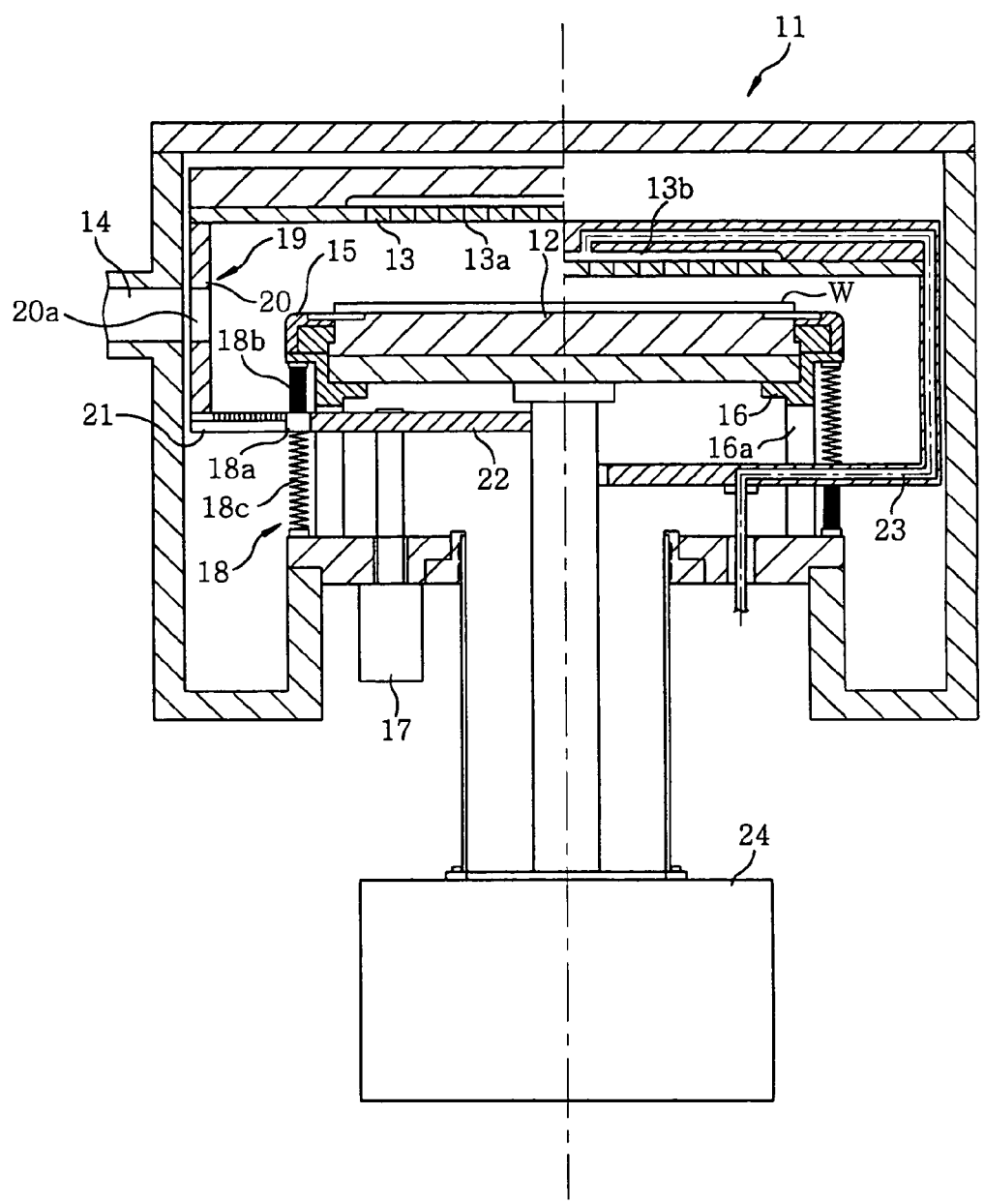
FIG. 1 shows an overall schematic cross sectional view of a plasma processing apparatus in accordance with a preferred embodiment of the present invention.

FIG. 1 shows a schematic cross sectional view of a plasma processing apparatus for etching a semiconductor wafer in accordance with a preferred embodiment of the present invention. A reference numeral 11 in FIG. 1 indicates a cylindrical vacuum chamber made of, e.g., aluminum, wherein the vacuum chamber 11 is grounded and an inner space thereof can be air-tightly sealed.

Installed inside the vacuum chamber 11 are a lower electrode 12 serving as a mounting table for approximately horizontally supporting a semiconductor wafer W serving as a substrate to be processed with a surface to be processed facing upward; and an upper electrode 13 installed above the lower electrode 12 so as to face the lower electrode 12 in parallel. A multiplicity of pores 13a are provided in a lower surface of the upper electrode 13. Therefore, a process gas is supplied from a process gas source (not shown) toward the semiconductor wafer W loaded on the lower electrode 12 via the pores 13a in a manner of a shower.

A gate 14 for loading and unloading the semiconductor wafer W into and from the vacuum chamber 11 is installed at a sidewall of the vacuum chamber 11. A focus ring 15 is installed on a mounting surface of the lower electrode 12 so as to surround the semiconductor wafer W loaded thereon.

Figure 2:
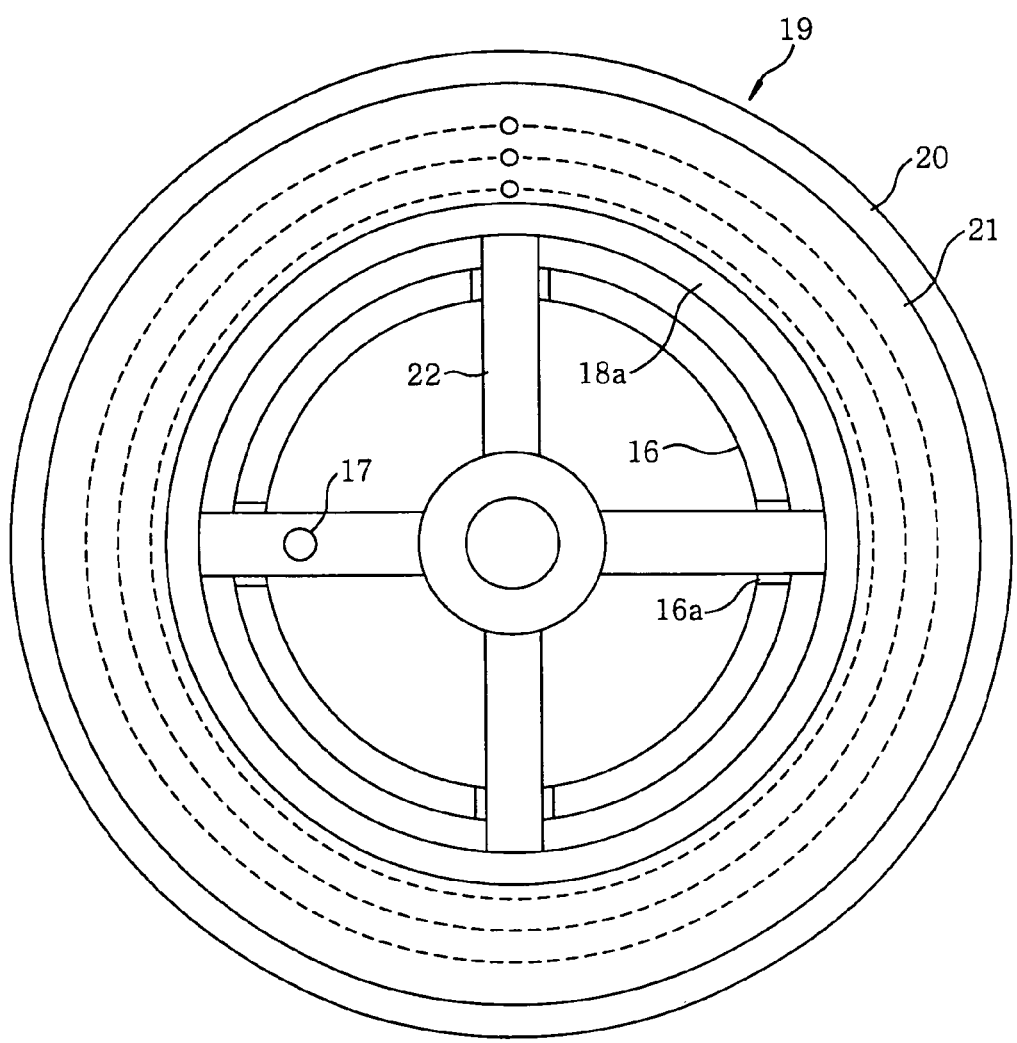
FIG. 2 illustrates a schematic view of principal parts of the plasma processing apparatus of FIG. 1.

The lower electrode 12 having an approximate disc shape is made of a conductive material, e.g., aluminum, and supported from a bottom portion of the vacuum chamber 11 by an approximately cylindrical lower electrode supporting member 16 made of an insulating material, e.g., ceramic. As illustrated in FIG. 2, provided at the lower electrode supporting member 16 are a plurality of (four in this preferred embodiment) openings 16a being spaced apart from each other at regular intervals in a circumferential direction thereof. Each of the openings 16a, which is for driving the upper electrode 13 by using an driving mechanism 17 installed outside the vacuum chamber 11, has a vertical length corresponding to a vertical stroke of a connecting member driven by the driving mechanism 17, wherein a description of the connecting member will be given later.

A cylindrical bellows unit 18 is concentrically installed contiguous to a peripheral portion of the lower electrode supporting member 16. The openings 16a can be air-tightly sealed by the bellows unit 18.

An intermediate ring of an annular shape (frame-shaped member) 18a is installed at vertically middle portion of the bellows unit 18. By vertically moving the intermediate ring 18a, an upper bellows portion 18b disposed above the intermediate ring 18a and a lower bellows portion 18c disposed below the intermediate ring 18a can be respectively extended and contracted in opposite directions.

The upper electrode 13 made of a conductive material, e.g., aluminum, is substantially disc-shaped and supported by an upper electrode supporting member 19. At the same time, the upper electrode 13 is connected to the intermediate ring 18a of the bellows unit 18 by the upper electrode supporting member 19, and vertically movable by the driving mechanism 17.

In this preferred embodiment, the upper electrode supporting member 19 includes a cylindrical member (deposition shield) 20 installed at a lower portion of the upper electrode 13; and an exhaust ring 21, having multiple through holes, installed at a lower portion of the cylindrical member 20. The upper electrode 13 is vertically movable with the cylindrical member 20 and the exhaust ring 21 as one unit.

The cylindrical member (deposition shield) 20 is installed to cover an inner wall of the vacuum chamber 11 in which a plasma is generated and processed. Accordingly, deposits (deposited materials) originating from the plasma process are prevented from being adhered to the inner wall of the vacuum chamber 11, and the inner wall thereof is protected from being etched by the plasma. The exhaust ring 21 serves to uniformly exhaust gases from the vacuum chamber 11 around the periphery of the lower electrode 12.

The exhaust ring 21 can be used to change a state of the etching process by adjusting a location thereof in a vertical direction. Therefore, as described above, by vertically moving the upper electrode 13 and the exhaust ring 21, it is possible to control the state of the etching process.

Formed at the cylindrical member (deposition shield) 20 is an opening 20a corresponding to the gate 14 installed in the vacuum chamber 11. Conventionally, an opening and closing device is installed at the gate 14 in order to prevent the plasma in the vacuum chamber 11 from being introduced into the gate 14. In this preferred embodiment, however, a vertical movement of the cylindrical member 20 replaces a function of the opening and closing device by aligning or misaligning the gate 14 and the opening 20a.

The upper electrode supporting member 19, the cylindrical member 20 and the exhaust ring 21 can be prepared separately and may be fixed together as a single body.

Further, as shown in FIG. 2, installed at an inner circumferential portion of the intermediate ring 18a (the outside of the vacuum chamber 11) is the spoke-shaped connecting member 22 passing through the openings 16a of the lower electrode supporting member 16 to extend to the inner circumferential portion thereof. The driving mechanism 17 and the intermediate ring 18a are mechanically connected to each other by the connecting member 22.

The driving mechanism 17 can vertically move the connecting member 22 and stop the connecting member 22 at a desired location by a driving source such as a motor, an air cylinder or the like. Accordingly, the connecting member 22, the intermediate ring 18a, the upper electrode supporting member 19 and the upper electrode 13 can vertically move as one unit, thereby enabling a distance (gap) from the upper electrode 13 to the lower electrode 12 to be set at a desired level.

In FIG. 1, the left half indicates a state in which the distance between the upper electrode 13 and the lower electrode 12 is widened by raising the upper electrode 13, and the right half illustrates a state in which the distance therebetween is narrowed by lowering the upper electrode 13.

As illustrated in the left half of the FIG. 1, in case the upper electrode 13 is raised, the upper bellows portion 18b above the intermediate ring 18a is contracted while the lower bellows portion 18c below the intermediate ring 18a is extended.

On the other hand, as shown in the right half of FIG. 1, in case the upper electrode 13 is lowered, the upper bellows portion 18b above the intermediate ring 18a is extended, but the lower bellows portion 18c below the intermediate ring 18a is contracted. In both cases, the upper bellows portion 18b and the lower bellows portion 18c are oppositely extended and contracted in accordance with the vertical movement of the intermediate ring 18a while maintaining a constant total length of the bellows unit 18.

By employing the above configuration, the distance from the upper electrode 13 to the lower electrode 12 can be varied while constantly maintaining a volume of the vacuum chamber 11. Therefore, the force resulting from the pressure difference between the inside and the outside of the vacuum chamber 11 is not at all exerted to the upper electrode 13 serving as a moving electrode, so that the upper electrode 13 can be easily maintained at a desired location. Furthermore, since the vertical movement of the upper electrode 13 is facilitated, the driving mechanism 17 does not require a huge driving force and, further, the device for driving the upper electrode 13 can be configured to be simple. Moreover, even in a case of augmenting the diameters of the upper electrode 13 and the lower electrode 12 in order to accommodate the semiconductor wafer W with an increased diameter, it is possible to easily meet the scaling up of the diameter since a force corresponding to an area of the moving electrode is not exerted thereto.

Formed inside the upper electrode 13 is a process gas diffusion cavity 13b for uniformly supplying a process gas from the pores 13a. A gas channel 23 for supplying the process gas from a process gas source (not shown) into the process gas diffusion cavity 13b is formed at the intermediate ring 18a, the connecting member 22 and the upper electrode supporting member 19 including the cylindrical member (deposition shield) 20 and the exhaust ring 21.

Installed at the lower electrode 12 are an electrostatic chuck (not shown) for adsorbing and maintaining the semiconductor wafer W; a coolant path (not shown) for circulating a coolant; a gas introduction mechanism (not shown) for supplying a cooling gas such as a He gas or the like to a backside of the semiconductor wafer W in order to efficiently transfer cold heat from the coolant to the semiconductor wafer W; and the like. Further, the lower electrode 12 is connected to a high frequency power source (not shown) for supplying a high frequency power, so that the high frequency power of a frequency ranging from, e.g., about 13.56 to 150 MHz, can be supplied to the lower electrode 12 via a matcher installed inside a matching box 24.

Connected to a bottom portion of the vacuum chamber 11 is a vacuum exhaust line (not shown) communicating with a vacuum exhaust system such as a vacuum pump and the like. Thus, the inner space of the vacuum chamber 11 can be exhausted via the exhaust ring 21, thereby setting the inner space thereof under a predetermined vacuum level.

Hereinafter, an etching process in the plasma etching apparatus configured as described above will be described.

First, a gate valve (not shown) installed at the gate 14 is opened. The semiconductor wafer W is loaded into the vacuum chamber 11 by a transfer mechanism (not shown) via a load-lock chamber installed adjacent to the gate 14, and then mounted on the lower electrode 12. Thereafter, the semiconductor wafer W mounted on the lower electrode 12 is held thereon by the electrostatic chuck.

Next, after the transfer mechanism is withdrawn out of the vacuum chamber 11, the gate valve is closed and then the inner space of the vacuum chamber 11 is evacuated by the vacuum pump or the like. When the inner space thereof reaches a predetermined vacuum level, the process gas for use in the etching process, which has a flow rate ranging from, e.g., about 100 to about 1000 sccm, is introduced from a process gas supplying system into the vacuum chamber 11 via the gas channel 23, the process gas diffusion cavity 13b and the pores 13a. Accordingly, the inner space of the vacuum chamber 11 is maintained under a predetermined pressure ranging from, e.g., about 1.33 to about 133 Pa (10 to 1000 mTorr).

In this state, a predetermined high frequency power ranging from, e.g., about 100 to about 3000 W with a frequency ranging form, e.g., about 13.56 to about 150 MHz, is supplied from the high frequency power source to the lower electrode 12.

By applying the high frequency power to the lower electrode 12 as described above, a high frequency electric field is formed in the processing space between the upper electrode 13 and the lower electrode 12 and, accordingly, the process gas supplied into the processing space becomes a plasma. Then, the plasma is used for etching a film on the semiconductor wafer W. At this time, an etching state of the film on the semiconductor wafer W is controlled by setting in advance the gap between the upper electrode 13 and the lower electrode 12 as a desired value by using the driving mechanism 17.

After performing the etching process, the application of the high frequency power from the high frequency power source is stopped to terminate the etching process. Thereafter, the semiconductor wafer W is unloaded from the vacuum chamber 11 in a reverse order of the loading sequence described above.

As described above, in accordance with this preferred embodiment, the load exerted to the device for varying the distance between the upper electrode 13 and the lower electrode 12 can be reduced in comparison with a conventional apparatus. Consequently, a manufacturing cost and a footprint of the apparatus can be reduced and, at the same time, it is possible to easily meet the scaling up of the semiconductor wafer W.

In the following, another preferred embodiment of the present invention will be described with reference to FIG. 3. In this preferred embodiment, lifter pins (substrate supporting members) 31 for supporting the semiconductor wafer W above the lower electrode 12 pass through through holes 30 provided at the lower electrode 12, and are fixed to the connecting member 22.

Figure 3:
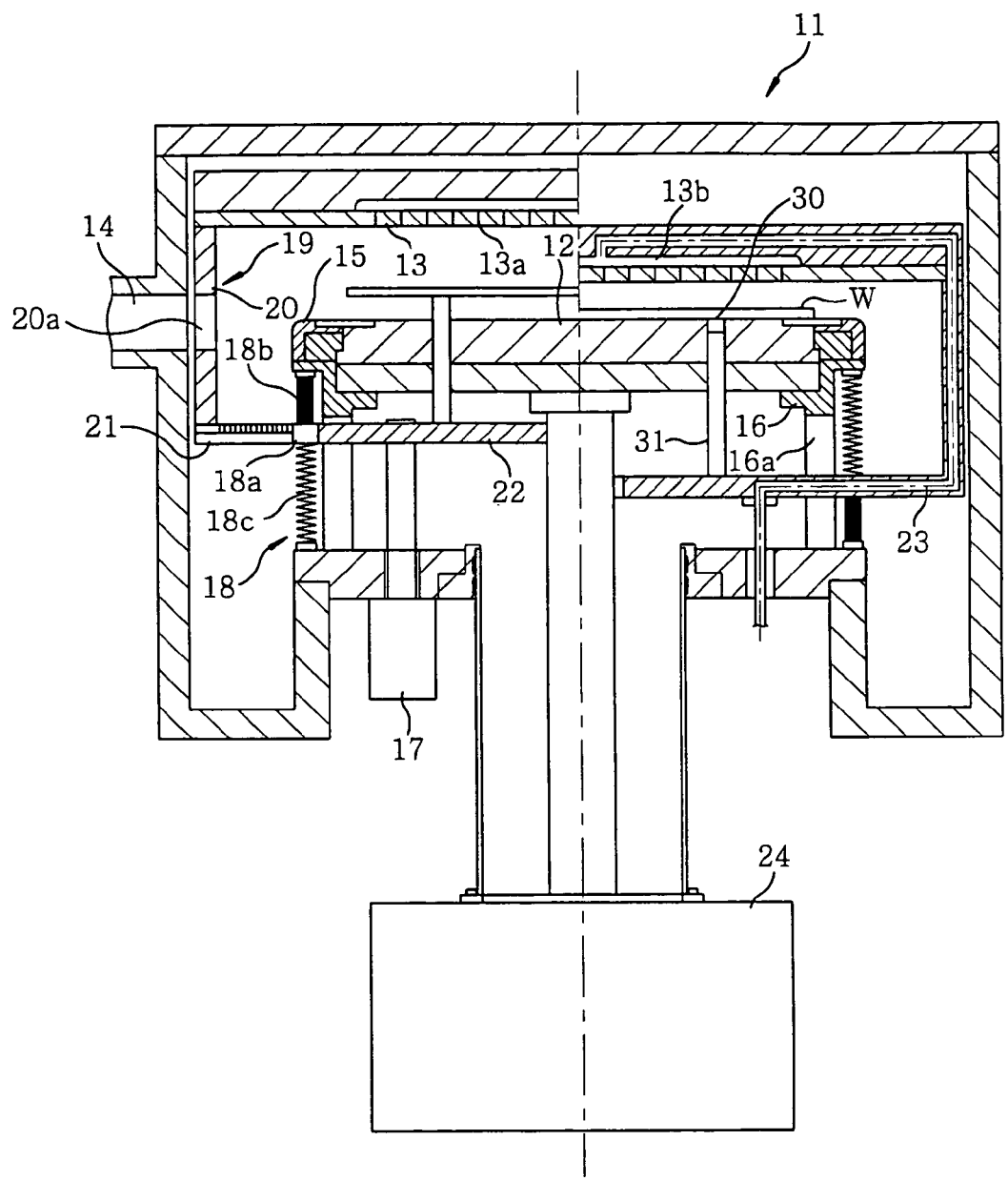
FIG. 3 depicts an overall schematic cross sectional view of a plasma processing apparatus in accordance with another preferred embodiment of the present invention.

As can be seen from the left half of FIG. 3, in case the upper electrode 13 is raised to a location that is not used in a normal etching process, the lifter pins 31 protrude above the lower electrode 12 and support the semiconductor wafer W thereon. On the other hand, in case the upper electrode 13 is lowered down to a location that is used in the normal etching process as shown in the right half of FIG. 3, the lifter pins 31 are retreated inside the lower electrode 12 and the semiconductor wafer W is loaded on the lower electrode 12.

By configuring the lifter pins 31 to be driven by the driving mechanism 17 for varying the gap between the upper electrode 13 and the lower electrode 12 as described above, there is no need to install a separate driving mechanism for driving the lifer pins 31, thereby simplifying the configuration of the apparatus and reducing the manufacturing cost thereof.

Figure 4:
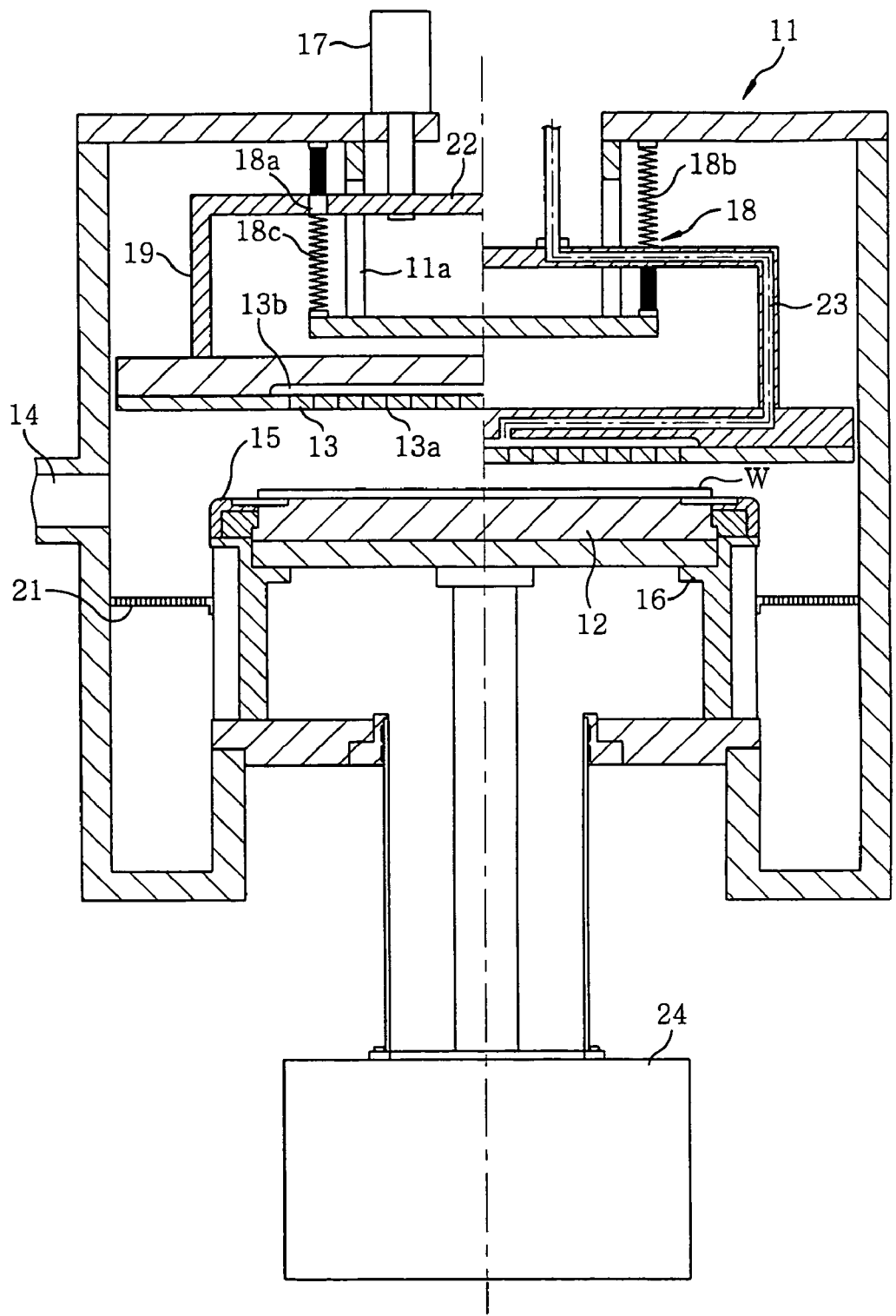
FIG. 4 describes an overall schematic cross sectional view of a plasma processing apparatus in accordance with still another preferred embodiment of the present invention.
Figure 5:
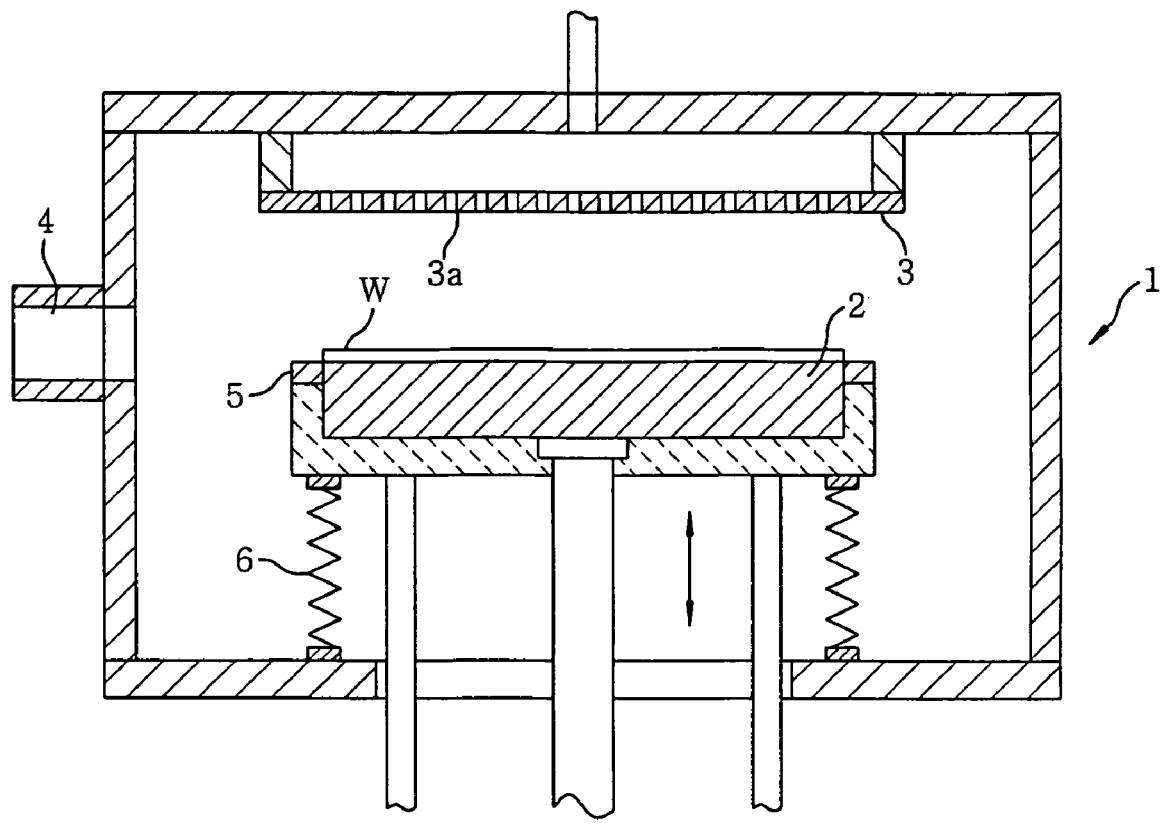
FIG. 5 provides an overall schematic cross sectional view of a conventional plasma processing apparatus.

FIG. 4 depicts a cross sectional view of still another preferred embodiment of the present invention. In this preferred embodiment, the upper electrode 13 is supported by an upper electrode supporting device 19 from above. Further, openings 11a having a similar configuration as in the aforementioned openings 16a are formed at a ceiling side of the vacuum chamber 11. Furthermore, installed at the top portion of the vacuum chamber 11 are the driving mechanism 17 for driving the upper electrode 13, the bellows unit 18 for air-tightly sealing the openings 11a of the vacuum chamber 11, and the like. Accordingly, same effects of the preferred embodiment shown in FIG. 1 can also be obtained in this preferred embodiment.

Although the preferred embodiments describe a case where the present invention is applied to a plasma etching apparatus for etching a semiconductor wafer, the present invention is not limited to thereto. For example, the present invention may be applied in processing a substrate other than the semiconductor wafer and, further, can be applied to a film forming processing apparatus for performing, e.g., a CVD process other than the etching process. Moreover, even though this preferred embodiment describes a case where the upper electrode is driven, the present invention can also be equally applied to a case where the lower electrode is driven.

While the invention has been shown and described with respect to the preferred embodiments, it will be understood by those skilled in the art that various changes and modifications may be made without departing from the spirit and scope of the invention as defined in the following claims.

What is claimed is:

1. A plasma processing apparatus comprising:
   a vacuum chamber accommodating therein a substrate to be processed, allowing an inner space of the vacuum chamber to be maintained at a vacuum level;
   a first electrode fixedly disposed at a location in the vacuum chamber;
   a second electrode installed in the vacuum chamber and facing the first electrode, the second electrode being vertically movable so as to vary a distance between the first electrode and the second electrode;
   a driving mechanism for vertically moving the second electrode, the driving mechanism being installed outside the vacuum chamber;
   a bellows unit for airtightly sealing an opening, the bellows unit having an upper bellows portion, a lower bellows portion, and a ring member connected to the driving mechanism, wherein the opening, through which the second electrode is driven by the driving mechanism via the ring member, is provided at the vacuum chamber, and the ring member is disposed between the upper bellows portion and the lower bellows portion, the bellows unit being connected to the first electrode;
   an electrode supporting member for supporting the second electrode and connecting the ring member to the second electrode, the entire electrode supporting member being installed in the inner space of the vacuum chamber; and
   a high frequency power source generating plasma by supplying a high frequency power between the first electrode and the second electrode,
   wherein the upper bellows portion and the lower bellows portion are oppositely extended and contracted in accordance with a vertical movement of the ring member while maintaining a constant total length of the bellows unit, and
   wherein the first electrode and the second electrode are a lower electrode and an upper electrode, respectively.

2. The plasma processing apparatus of claim 1, wherein the upper electrode is supported from underneath the lower electrode.

3. The plasma processing apparatus of claim 2, wherein the electrode supporting member includes an exhaust ring for uniformly exhausting the vacuum chamber.

4. The plasma processing apparatus of claim 2, wherein the electrode supporting member includes a cylindrical member for protecting an inner wall of the vacuum chamber.

5. The plasma processing apparatus of claim 2, further comprising a substrate supporting member for supporting the substrate to be processed above the lower electrode, the substrate supporting member being vertically movable by the driving mechanism to pass through the lower electrode.

6. The plasma processing apparatus of claim 1, wherein the distance between the first electrode and the second electrode is varied while constantly maintaining a volume of the vacuum chamber maintained in vacuum.

7. A vacuum processing apparatus comprising:
   a vacuum chamber accommodating therein a substrate to be processed, allowing an inner space of the vacuum chamber to be maintained at a vacuum level;
   a first structure fixedly disposed at a location in the vacuum chamber;
   a second structure installed in the vacuum chamber and facing the first structure, the second structure being vertically movable so as to vary a distance between the first structure and the second structure;
   a driving mechanism for vertically moving the second structure, the driving mechanism being installed outside the vacuum chamber;
   a bellows unit for airtightly sealing an opening, the bellows unit having an upper bellows portion, a lower bellows portion, and a ring member connected to the driving mechanism, wherein the opening, through which the second structure is driven by the driving mechanism via the ring member, is provided at the vacuum chamber, and the ring member is disposed between the upper bellows portion and the lower bellows portion, the bellows unit being connected to the first structure; and
   a structure supporting member for supporting the second structure and connecting the ring member to the second structure, the entire structure supporting member being installed in the inner space of the vacuum chamber,
   wherein the upper bellows portion and the lower bellows portion are oppositely extended and contracted in accordance with a vertical movement of the ring member while maintaining a constant total length of the bellows unit, and
   wherein the first structure and the second structure are a lower electrode and an upper electrode, respectively.

8. The vacuum processing apparatus of claim 7, wherein the upper electrode is supported from underneath the lower electrode.

9. The vacuum processing apparatus of claim 8, wherein the structure supporting member includes an exhaust ring for uniformly exhausting the vacuum chamber.

10. The vacuum processing apparatus of claim 8, wherein the structure supporting member includes a cylindrical member for protecting an inner wall of the vacuum chamber.

11. The vacuum processing apparatus of claim 8, further comprising a substrate supporting member for supporting the substrate to be processed above the lower electrode, the substrate supporting member being vertically movable by the driving mechanism to pass through the lower electrode.

12. The vacuum processing apparatus of claim 7, wherein the distance between the first electrode and the second electrode is varied while constantly maintaining a volume of the vacuum chamber maintained in vacuum.

* * * * *